US011600793B2

(12) United States Patent
Han et al.

(10) Patent No.: US 11,600,793 B2
(45) Date of Patent: Mar. 7, 2023

(54) DISPLAY PANEL HAVING TRANSMISSION AREA BETWEEN PIXEL CIRCUITS AND ELECTRONIC APPARATUS INCLUDING THE SAME

(71) Applicant: Samsung Display Co., Ltd., Yongin-Si (KR)

(72) Inventors: Jaebum Han, Yongin-si (KR); Younggil Park, Yongin-si (KR); Junghwa Park, Yongin-si (KR); Nari Ahn, Yongin-si (KR); Sooim Jeong, Yongin-si (KR)

(73) Assignee: Samsung Display Co., Ltd.

( * ) Notice: Subject to any disclaimer, the term of this patent is extended or adjusted under 35 U.S.C. 154(b) by 95 days.

(21) Appl. No.: 17/135,820

(22) Filed: Dec. 28, 2020

(65) Prior Publication Data
US 2021/0305521 A1    Sep. 30, 2021

(30) Foreign Application Priority Data

Mar. 25, 2020    (KR) .......................... 10-2020-0036439

(51) Int. Cl.
*H01L 51/00* (2006.01)
*H01L 51/52* (2006.01)
(Continued)

(52) U.S. Cl.
CPC ...... *H01L 51/0097* (2013.01); *C08G 73/1071* (2013.01); *H01L 27/323* (2013.01);
(Continued)

(58) Field of Classification Search
CPC ............. H01L 51/0097; H01L 51/5253; H01L 51/5281; H01L 51/52; H01L 51/0096; H01L 51/5246; H01L 2251/301; H01L 2251/5338; H01L 27/323; H01L 27/3234; H01L 27/3258; H01L 27/3262; H01L 27/3265; H01L 27/3272; H01L 27/1225; H01L 27/1255; H01L 27/326; H01L 27/3218; H01L 27/1218; H01L 27/14678; H01L 27/3246; H01L 29/78633;
(Continued)

(56) References Cited

U.S. PATENT DOCUMENTS 9,318,359 B2    4/2016    Lim et al.
9,911,941 B2    3/2018    Choi et al.
(Continued)

FOREIGN PATENT DOCUMENTS

KR    10-2012-0078514 A    7/2012
KR    10-1368818 B1    3/2014
(Continued)

*Primary Examiner* — Ida M Soward
(74) *Attorney, Agent, or Firm* — Innovation Counsel LLP

(57) ABSTRACT

A display panel includes the following elements: a substrate including a first base layer, wherein the first base layer includes a transparent polyimide resin; a first pixel circuit and a second pixel circuit over the substrate, spaced from each other with the transmission area between the first pixel circuit and the second pixel circuit, and each including transistors and a storage capacitor; a first display element electrically connected to the first pixel circuit; and a second display element electrically connected to the second pixel circuit.

20 Claims, 7 Drawing Sheets

(51) Int. Cl.
    *H01L 27/12* (2006.01)
    *H01L 27/14* (2006.01)
    *H01L 27/32* (2006.01)
    *H01L 29/78* (2006.01)
    *G02F 1/13* (2006.01)
    *C08G 73/10* (2006.01)
    *H01L 29/786* (2006.01)
    *G02F 1/1333* (2006.01)
    *H01L 27/146* (2006.01)

(52) U.S. Cl.
    CPC ...... *H01L 27/3234* (2013.01); *H01L 27/3258* (2013.01); *H01L 27/3262* (2013.01); *H01L 27/3265* (2013.01); *H01L 27/3272* (2013.01); *H01L 51/5253* (2013.01); *H01L 51/5281* (2013.01); *G02F 1/133331* (2021.01); *H01L 27/1225* (2013.01); *H01L 27/1255* (2013.01); *H01L 27/14678* (2013.01); *H01L 27/3246* (2013.01); *H01L 29/7869* (2013.01); *H01L 29/78633* (2013.01); *H01L 2251/301* (2013.01); *H01L 2251/5338* (2013.01)

(58) Field of Classification Search
    CPC ........... H01L 29/7869; H01L 29/42384; H01L 29/78645; G02F 1/133331
    See application file for complete search history.

(56) References Cited

U.S. PATENT DOCUMENTS 10,186,567 B2    1/2019   Jeong et al.

| | | | |
|---|---|---|---|
| 2016/0233289 A1* | 8/2016 | Son | H01L 27/326 |
| 2016/0260787 A1* | 9/2016 | Kim | H01L 27/326 |
| 2017/0069871 A1* | 3/2017 | Yim | H01L 51/5234 |
| 2017/0077209 A1* | 3/2017 | Kim | H01L 27/326 |
| 2017/0084635 A1* | 3/2017 | Jung | H01L 27/1285 |
| 2017/0104048 A1* | 4/2017 | Chung | H01L 27/1218 |
| 2017/0117349 A1* | 4/2017 | Jeon | H01L 51/5228 |
| 2017/0148860 A1* | 5/2017 | Park | H01L 27/3248 |
| 2017/0148861 A1* | 5/2017 | Kim | H01L 27/3211 |
| 2017/0194415 A1* | 7/2017 | Choi | H01L 51/5056 |
| 2017/0330923 A1* | 11/2017 | Chung | H01L 27/1248 |
| 2018/0026082 A1* | 1/2018 | Lee | G02F 1/133553 349/96 |
| 2018/0145118 A1* | 5/2018 | Kim | H01L 51/56 |
| 2018/0210306 A1* | 7/2018 | Okabe | G02F 1/1335 |
| 2019/0393444 A1* | 12/2019 | Nam | H01L 27/326 |
| 2020/0020747 A1* | 1/2020 | Bok | G06F 3/0443 |
| 2020/0273927 A1* | 8/2020 | Oh | H01L 27/326 |
| 2020/0295300 A1* | 9/2020 | Chung | H01L 51/5225 |
| 2020/0365667 A1* | 11/2020 | Jo | H01L 27/3246 |
| 2020/0381489 A1* | 12/2020 | Hwang | H01L 27/3218 |
| 2020/0411605 A1* | 12/2020 | Moon | H01L 27/3218 |

FOREIGN PATENT DOCUMENTS

| KR | 10-2016-0046152 A | 4/2016 |
|---|---|---|
| KR | 10-2016-0130042 A | 11/2016 |
| KR | 10-1994816 B1 | 7/2019 |
| KR | 10-2045441 B1 | 11/2019 |

* cited by examiner

DISPLAY PANEL HAVING TRANSMISSION AREA BETWEEN PIXEL CIRCUITS AND ELECTRONIC APPARATUS INCLUDING THE SAME

CROSS-REFERENCE TO RELATED APPLICATION

This application claims priority to and the benefit of Korean Patent Application No. 10-2020-0036439, filed on Mar. 25, 2020, in the Korean Intellectual Property Office; the Korean Patent Application is incorporated by reference.

BACKGROUND

1. Field

The technical field relates to a display panel and an electronic apparatus including the display panel.

2. Description of Related Art

Display panels have been used for displaying images. Generally, it is desirable for display panels to be thin and lightweight.

In a display area of a display panel, in addition to image display, various functions may be implemented. For example, a touch sensing function may be implemented in a display area of a display panel.

SUMMARY

In order to add various functions to a display panel, electronic components such as cameras or sensors may be arranged in a display area of the display panel. In embodiments, satisfactory performance of the electronic components may be attained and/or maintained.

According to one or more embodiments, a display panel including a transmission area includes a substrate including at least one base layer and at least one barrier layer, a first pixel circuit and a second pixel circuit arranged over the substrate, spaced apart from each other with the transmission area therebetween, and each including thin film transistors and a storage capacitor, a first display element electrically connected to the first pixel circuit, and a second display element electrically connected to the second pixel circuit, wherein the at least one base layer includes a transparent polyimide resin, and the thin film transistors of the first pixel circuit and the thin film transistors of the second pixel circuit include a semiconductor layer and a gate electrode arranged over the semiconductor layer.

According to the present embodiments, the polyimide resin may have a yellowness index (YI) of about 10 or less, may have a transmittance of light with a wavelength band of about 400 nm or less in a range of about 70% or more and about 90% or less, or may have a YI of about 10 or less and have a transmittance of light with a wavelength band of about 400 nm or less in a range of about 70% or more and about 90% or less.

According to the present embodiments, the polyimide resin may include a polymer compound including a repeating unit represented as Formula 1 below:

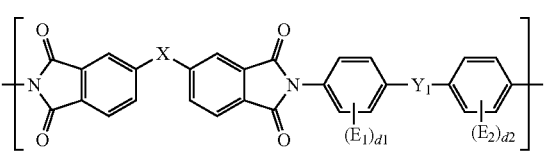
<Formula 1>

Where

X may be selected as one of $C(CR_1R_2R_3)_2$, O, $SO_2$, and C=O, $R_1$ to $R_3$ may be independently selected as one of —F, —Cl, —Br, and —I, $Y_1$ may be selected as one of a single bond, O, and $SO_2$, $E_1$ and $E_2$ may be independently hydrogen or $CF_3$, and $d_1$ and $d_2$ may be independently an integer of 1 to 4.

According to the present embodiments, in Formula 1, X may be $C(CF_3)_2$, Y may be a single bond, and $E_1$ and $E_2$ may be —$CF_3$.

According to the present embodiments, the polyimide resin may include a polymer compound including a repeating unit represented as Formula 2 below:

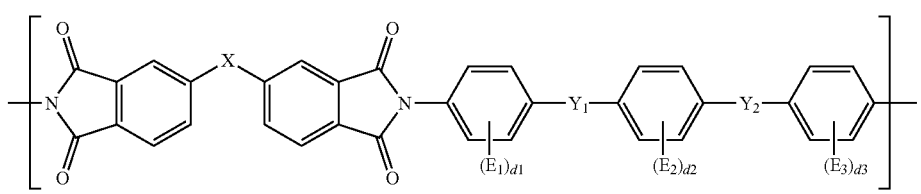
<Formula 2>

Where

X may be selected as one of $C(CR_1R_2R_3)_2$, O, $SO_2$, and C=O, $R_1$ to $R_3$ may be independently selected as one of —F, —Cl, —Br, and —I, $Y_1$ may be selected as one of a single bond, O, and $SO_2$, $Y_2$ may be selected as one of a single bond, O, and $SO_2$, $E_1$ to $E_3$ may be independently hydrogen or —$CF_3$, and $d_1$ to $d_3$ may be independently an integer of 1 to 4.

According to the present embodiments, the semiconductor layer may include an oxide semiconductor material.

According to the present embodiments, the substrate may include a first base layer, a first barrier layer, a second base layer, and a second barrier layer sequentially stacked, the first base layer and the second base layer may include a transparent polyimide resin, and the first barrier layer and the second barrier layer may include an inorganic insulating material.

According to the present embodiments, the display panel may further include a planarization layer covering the first pixel circuit and the second pixel circuit, a first pixel electrode and a second pixel electrode arranged on the planarization layer and respectively electrically connected to the first pixel circuit and the second pixel circuit through a contact hole formed in the planarization layer, an intermediate layer arranged on the first pixel electrode and the second pixel electrode, and an opposite electrode arranged on the intermediate layer.

According to the present embodiments, the display panel may further include at least one insulating layer located between the planarization layer and the semiconductor layer, and a thin film encapsulation layer entirely covering the opposite electrode and including at least one inorganic layer and at least one organic layer.

According to the present embodiments, the insulating layer and the planarization layer may each include a hole corresponding to the transmission area, and a portion of the at least one organic layer may be located in the hole.

According to the present embodiments, the display panel may further include a lower conductive layer arranged under the semiconductor layer.

According to the present embodiments, the first pixel circuit and the second pixel circuit may each include a driving thin film transistor, and a semiconductor layer of the driving thin film transistor and the lower conductive layer may be electrically connected to each other.

According to the present embodiments, the display panel may further include at least one insulating layer arranged over the semiconductor layer, a first electrode contacting the semiconductor layer through a first contact hole formed in the insulating layer, and a connection metal contacting the lower conductive layer through a second contact hole formed in the insulating layer, wherein the first electrode and the connection metal may be formed on a same layer and may be connected to each other.

According to the present embodiments, the gate electrode may include a first layer, and a second layer including a different material than the first layer, wherein the second layer may include titanium.

According to one or more embodiments, an electronic apparatus includes a display panel including a display area including a transmission area, and an electronic component arranged to overlap at least the transmission area, wherein the display panel includes a substrate including at least one base layer and at least one barrier layer, a first pixel circuit and a second pixel circuit arranged over the substrate, apart from each other with the transmission area therebetween, and each including thin film transistors and a storage capacitor, a planarization layer arranged on the first pixel circuit and the second pixel circuit, a first pixel electrode and a second pixel electrode arranged on the planarization layer and respectively electrically connected to the first pixel circuit and the second pixel circuit through a contact hole formed in the planarization layer, an opposite electrode facing the first pixel electrode and the second pixel electrode, an intermediate layer between the first pixel electrode and the second pixel electrode and the opposite electrode, and a plurality of insulating layers located between the substrate and the planarization layer and including a hole corresponding to the transmission area, wherein the at least one base layer includes a transparent polyimide resin, and the thin film transistors of the first pixel circuit and the thin film transistors of the second pixel circuit each include a semiconductor layer including an oxide semiconductor and a gate electrode arranged over the semiconductor layer.

According to the present embodiments, the polyimide resin may have a yellowness index (YI) of about 10 or less, may have a transmittance of light with a wavelength band of about 400 nm or less in a range of about 70% or more and about 90% or less, or may have a YI of about 10 or less and have a transmittance of light with a wavelength band of about 400 nm or less in a range of about 70% or more and about 90% or less.

According to the present embodiments, the polyimide resin may include a polymer compound including a repeating unit represented as Formula 1 below:

<Formula 1>

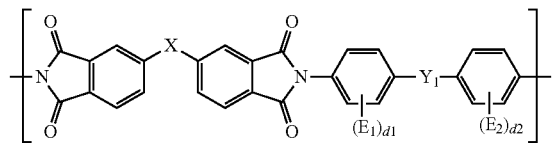

where

X may be selected as one of $C(CR_1R_2R_3)_2$, O, $SO_2$, and $C=O$, $R_1$ to $R_3$ may be independently selected as one of —F, —Cl, —Br, and —I, $Y_1$ may be selected as one of a single bond, O, and $SO_2$, $E_1$ and $E_2$ may be independently hydrogen or $CF_3$, and $d_1$ and $d_2$ may be independently an integer of 1 to 4.

According to the present embodiments, the polyimide resin may include a polymer compound including a repeating unit represented as Formula 2 below:

<Formula 2>

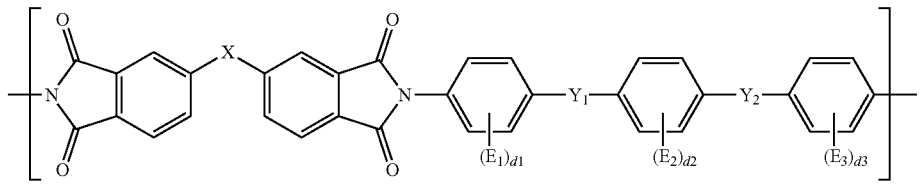

where

X may be selected as one of $C(CR_1R_2R_3)_2$, O, $SO_2$, and $C=O$, $R_1$ to $R_3$ may be independently selected as one of —F, —Cl, —Br, and —I, $Y_1$ may be selected as one of a single bond, O, and $SO_2$, $Y_2$ may be selected as one of a single bond, O, and $SO_2$, $E_1$ to $E_3$ may be independently hydrogen or —$CF_3$, and $d_1$ to $d_3$ may be independently an integer of 1 to 4.

According to the present embodiments, the electronic apparatus may further include a thin film encapsulation layer entirely covering the opposite electrode and including at least one inorganic layer and at least one organic layer, wherein a portion of the at least one organic layer may be located in the hole.

According to the present embodiments, the electronic apparatus may further include a lower conductive layer arranged under the semiconductor layer.

An embodiment may be related to a display panel. The display panel may include the following elements: a substrate including a first base layer, wherein the first base layer may include a transparent polyimide resin; a first transistor overlapping the first base layer; a second transistor overlapping the first base layer and spaced from the first transistor; a first insulating layer overlapping the first base layer and including a first hole, wherein the first hole may be positioned between the first transistor and the second transistor and may partially expose the first base layer; a first display element electrically connected to the first transistor; and a second display element electrically connected to the second transistor, wherein the first hole is positioned between the first display element and the second display element.

The transparent polyimide resin may have a yellowness index (YI) of about 10 or less, and may have a transmittance of light with a wavelength band of about 400 nm or less in a range of about 70% or to about 90%.

The transparent polyimide resin may include a polymer compound including a repeating unit represented by Formula 1:

<Formula 1>

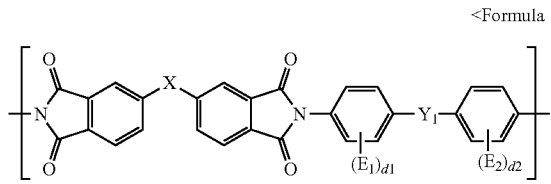

X may be one of $C(CR_1R_2R_3)_2$, O, $SO_2$, and C=O; $R_1$, $R_2$, and $R_3$ may be independently one of —F, —Cl, —Br, and —I; $Y_1$ may be one of a single bond, O, and $SO_2$;

$E_1$ and $E_2$ may be independently hydrogen or —$CF_3$; and $d_1$ and $d_2$ may be independently an integer in a range of 1 to 4.

In Formula 1, X may be $C(CF_3)_2$, Y may be a single bond, and each of $E_1$ and $E_2$ may be —$CF_3$.

The transparent polyimide resin may include a polymer compound including a repeating unit represented by Formula 2:

<Formula 2>

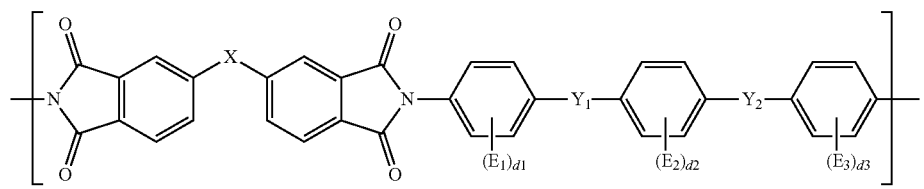

X may be one of $C(CR_1R_2R_3)_2$, O, $SO_2$, and C=O; $R_1$, $R_2$, and $R_3$ may be independently one of —F, —Cl, —Br, and —I; $Y_1$ may be one of a single bond, O, and $SO_2$;

$Y_2$ may be one of a single bond, O, and $SO_2$; $E_1$, $E_2$, and $E_3$ may be independently hydrogen or —$CF_3$; and $d_1$, $d_2$, and $d_3$ may be independently an integer in range of 1 to 4.

The first transistor may include a semiconductor layer. The semiconductor layer may include an oxide semiconductor material.

The substrate may include a first barrier layer and a second base layer. The first barrier layer may be positioned between the first base layer and the second base layer. The second base layer may include the transparent polyimide resin. The first barrier layer may include an inorganic insulating material.

The display panel may include a planarization layer covering the first transistor and the second transistor. The first display element may include the following elements: a first pixel electrode arranged on the planarization layer and electrically connected to the first transistor through a contact hole formed in the planarization layer; an intermediate layer arranged on the first pixel electrode; and an opposite electrode arranged on the intermediate layer.

The display panel may include an encapsulation layer covering the opposite electrode and including an inorganic layer and an organic layer.

The planarization layer each may include a second hole corresponding to the first hole. The organic layer may be at least partially located in each of the first hole and the second hole.

The display panel may include a conductive layer positioned between the first transistor and the first base layer and electrically connected to the first transistor.

The first transistor may include a semiconductor layer electrically connected to the conductive layer.

The display panel may include the following elements: a first electrode contacting the semiconductor layer through a first contact hole formed in the first insulating layer; and a connection metal contacting the conductive layer through a second contact hole formed in the first insulating layer. The first electrode and the connection metal may be formed of a same material and may be electrically connected to each other.

The first transistor may include a gate electrode that may include the following layers: a first conductive layer; and a second conductive layer directly contacting the first conductive layer. The second conductive layer may include titanium. The first conductive layer may include no titanium.

An embodiment may be related to an electronic apparatus. The electronic apparatus may include the following elements: a display panel; and an electronic component overlapping the display panel. The display panel may include the following elements: a substrate including a first base layer, wherein the first base layer may include a transparent polyimide resin; a first transistor overlapping the first base layer and including a semiconductor layer, wherein the semiconductor layer may include an oxide semiconductor; a second transistor overlapping the first base layer and spaced from the first transistor, wherein the electronic component may be at least partially exposed between the first transistor and the second transistor; a planarization layer arranged on the first transistor and the second transistor; a first pixel electrode and a second pixel electrode arranged on the planarization layer and respectively electrically connected to the first transistor and the second transistor through two contact holes formed in the planarization layer; an opposite electrode overlapping the first pixel electrode and the second pixel electrode; and an intermediate layer positioned between the first pixel electrode and the opposite electrode.

The transparent polyimide resin may have a yellowness index (YI) of about 10 or less, and may have a transmittance of light with a wavelength band of about 400 nm or less in a range of about 70% or to about 90%.

The transparent polyimide resin may include a polymer compound including a repeating unit represented by Formula 1:

<Formula 1>

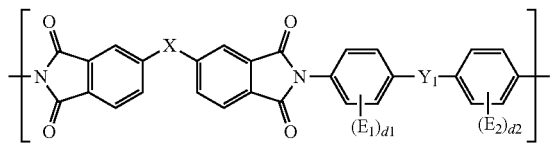

X may be one of $C(CR_1R_2R_3)_2$, O, $SO_2$, and C=O; $R_1$, $R_2$, and $R_3$ may be independently one of —F, —Cl, —Br, and —I; $Y_1$ may be one of a single bond, O, and $SO_2$; $E_1$ and $E_2$ may be independently hydrogen or —$CF_3$; and $d_1$ and $d_2$ may be independently an integer in a range of 1 to 4.

The transparent polyimide resin may include a polymer compound including a repeating unit represented by Formula 2:

<Formula 2>

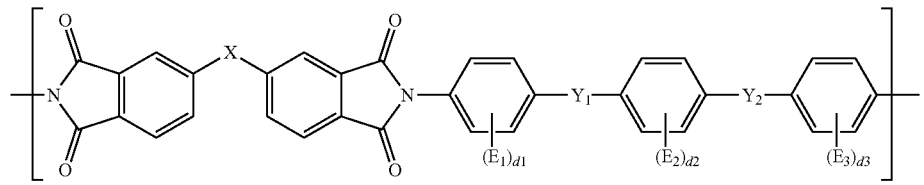

X may be one of $C(CR_1R_2R_3)_2$, O, $SO_2$, and C=O; $R_1$, $R_2$, and $R_3$ may be independently one of —F, —Cl, —Br, and —I; $Y_1$ may be one of a single bond, O, and $SO_2$; $Y_2$ may be one of a single bond, O, and $SO_2$; $E_1$, $E_2$, and $E_3$ may be independently hydrogen or —$CF_3$; and $d_1$, $d_2$, and $d_3$ may be independently an integer in a range of 1 to 4.

The electronic apparatus of claim 15, may include the following elements: a first insulating layer located between the substrate and the planarization layer and including a hole that at least partially exposes the electronic component; an encapsulation layer covering the opposite electrode and including an inorganic layer and an organic layer. The organic layer may be at least partially located in the hole.

The electronic apparatus may include a conductive layer arranged between the semiconductor layer and the first base layer and electrically connected to the semiconductor layer.

DETAILED DESCRIPTION

Figure 1:
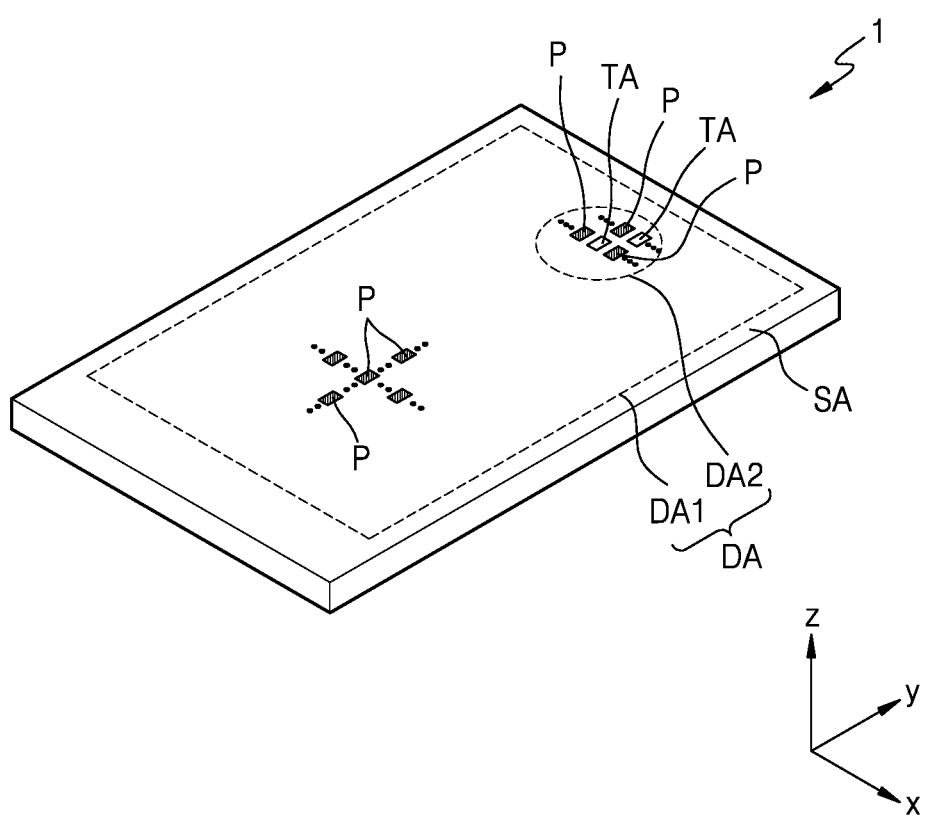
FIG. 1 is a perspective view schematically illustrating an electronic apparatus according to an embodiment.

Example embodiments are described with reference to the accompanying drawings, wherein like reference numerals may refer to like elements.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The singular forms "a," "an," and "the" may indicate the plural forms as well, unless the context clearly indicates otherwise.

It will be understood that terms such as "comprise," "include," and "have" used herein specify the presence of stated features or components, but do not preclude the presence or addition of one or more other features or components. It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description.

When a certain embodiment may be implemented differently, a particular process order may be performed differently from the described order. For example, two consecutively described processes may be performed substantially at the same time or performed in an order opposite to the described order.

As used herein, "A and/or B" represents the case of A, B, or A and B. Also, "at least one of A and B" represents the case of A, B, or A and B.

The x axis, the y axis, and the z axis may or may not be perpendicular to each other.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control."

FIG. 1 is a perspective view schematically illustrating an electronic apparatus according to an embodiment.

Referring to FIG. 1, an electronic apparatus 1 may include a display area DA and a peripheral area SA located outside the display area DA. The electronic apparatus 1 may provide an image through an array of pixels P two-dimensionally arranged in the display area DA. Pixels P may be arranged in a first display area DA1 and a second display area DA2, and the allocation of pixels P arranged in the first display area DA1 may be different from the allocation of pixels P arranged in the second display area DA2. For example, pixels P may be consecutively arranged in the first display area DA1, and transmission areas TA may be arranged between pixels P arranged in the second display area DA2.

The electronic apparatus 1 may provide a first image using light emitted from the pixels P arranged in the first display area DA1 and may provide a second image using light emitted from the pixels P arranged in the second display area DA2. The first image and the second image may be portions of a same image or may be independent of each other.

The second display area DA2 may include a transmission area TA located between two neighboring pixels P. The transmission area TA may transmit light and may include no pixel that emits light.

The peripheral area SA may not provide an image and may entirely or partially surround the display area DA. A driver for providing an electrical signal or power to the pixels PX may be arranged in the peripheral area SA. The peripheral area SA may include a pad for connecting the electronic apparatus 1 to an electronic device, a printed circuit board, or the like.

The second display area DA2 may have a circular shape or may have an elliptical shape in a plan view. Alternatively or additionally, the second display area DA2 may have a polygonal shape such as a tetragon shape or a bar shape.

The second display area DA2 may be arranged inside the first display area DA1 or may be arranged on one side of the first display area DA1. As illustrated in FIG. 1, the second display area DA2 may be entirely surrounded by the first display area DA1. In some embodiments, the second display area DA2 may be partially surrounded by the first display area DA1. For example, the second display area DA2 may be partially surrounded by the first display area DA1 and may be located at a corner portion of the first display area DA1.

The ratio of the second display area DA2 to the display area DA may be smaller than the ratio of the first display area DA1 to the display area DA. The electronic apparatus 1 may include one second display area DA2 as illustrated in FIG. 1 or may include two or more second display areas DA2.

The electronic apparatus 1 may include/be a mobile phone, a tablet PC, a notebook, a smart band, or a smart watch.

Figure 2:
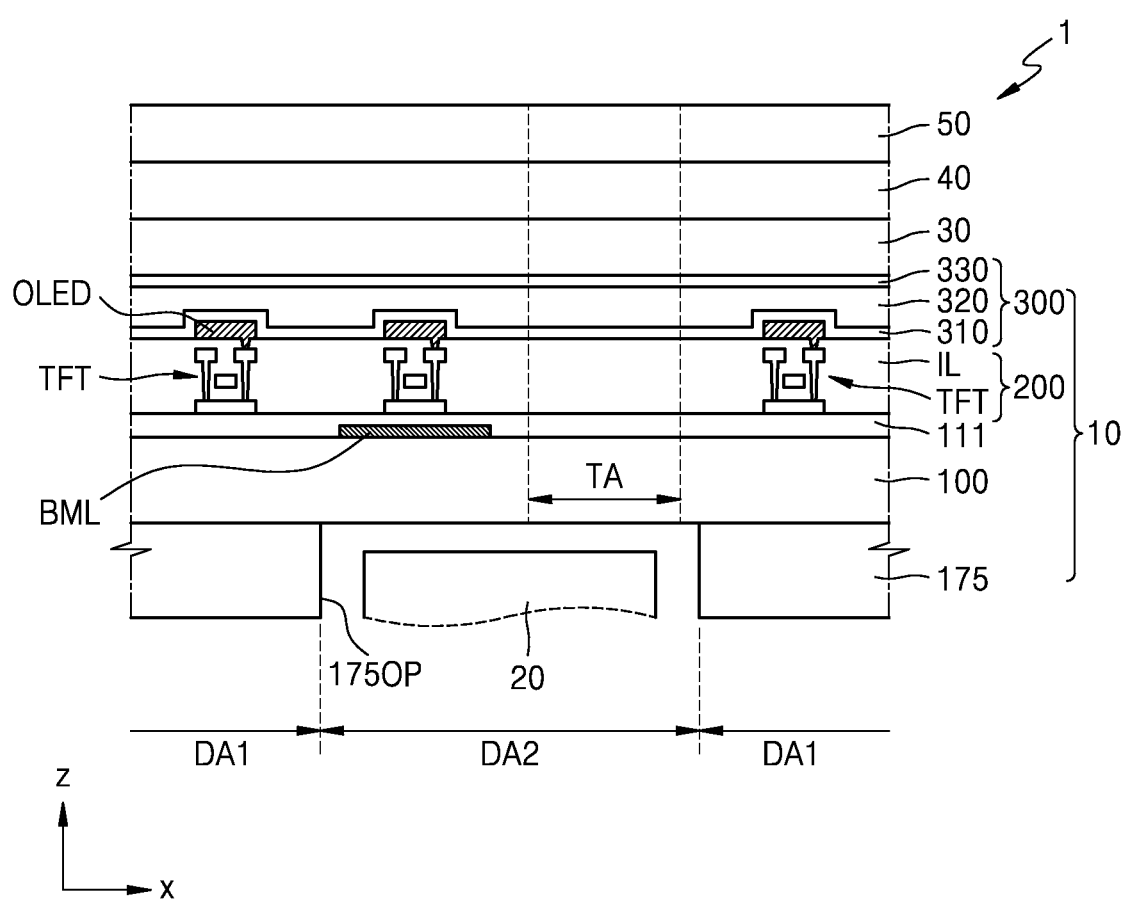
FIG. 2 is a cross-sectional view schematically illustrating a portion of an electronic apparatus according to an embodiment.

FIG. 2 is a cross-sectional view schematically illustrating a portion of an electronic apparatus according to an embodiment.

Referring to FIG. 2, the electronic apparatus 1 may include a display panel 10, an electronic component 20, an input sensing layer 30, and an optical functional layer 40. The display panel 10, the input sensing layer 30, and the optical functional layer 40 may be sequentially stacked, and a window 50 may be arranged on the optical functional layer 40.

The display panel 10 may include a substrate 100, a display layer 200 arranged on the substrate 100, and a thin film encapsulation layer 300 on the display layer 200.

The substrate 100 may include a polymer resin. The polymer resin may include polyether sulfone, polyacrylate, polyether imide, polyethylene naphthalate, polyethylene terephthalate, polyphenylene sulfide, polyarylate, polyimide, polycarbonate, or cellulose acetate propionate. The substrate 100 may be flexible, rollable, or bendable. The substrate 100 may have a multilayer structure including an inorganic layer (not illustrated) and a layer including the above polymer resin. The structure of the substrate 100 is further described with reference to FIG. 5.

The display layer 200 may be arranged on the front surface of the substrate 100, and a lower protection film 175 may be arranged on the rear surface of the substrate 100. The lower protection film 175 may be attached to the rear surface of the substrate 100. An adhesive layer may be located between the lower protection film 175 and the substrate 100. Alternatively, the lower protection film 175 may be directly formed on the rear surface of the substrate 100, and no adhesive layer may be located between the lower protection film 175 and the substrate 100.

The lower protection film 175 may support and protect the substrate 100. The lower protection film 175 may include an opening 1750P corresponding to the second display area DA2. Because the lower protection film 175 includes the opening 1750P, the light transmittance of the second display area DA2 and/or the light transmittance of the transmission area TA may be optimized and/or improved. The lower protection film 175 may include polyethylene terephthalate (PET) or polyimide (PI).

The display layer 200 may include a circuit layer including a thin film transistor TFT, a display element layer including an organic light emitting diode OLED as a display element, and an insulating layer IL. A thin film transistor TFT and an organic light emitting diode OLED electrically connected to the thin film transistor TFT may be arranged in each of the first display area DA1 and the second display area DA2. The second display area DA2 may include a transmission area TA in which no thin film transistor TFT or organic light emitting diode OLED is arranged. The transmission area TA may transmit the light emitted from the electronic component 20 and/or directed to the electronic component 20.

The thin film encapsulation layer 300 may include at least one inorganic layer and at least one organic layer. In an embodiment, the thin film encapsulation layer 300 may include first and second inorganic encapsulation layers 310 and 330 and an organic encapsulation layer 320 between the layers 310 and 330.

The input sensing layer 30 may be arranged on the display panel 10. The input sensing layer 30 may acquire coordinate information according to an external input, for example, a touch event. The input sensing layer 30 may include a sensing electrode (or a touch electrode) and trace lines connected to the sensing electrode. The input sensing layer 30 may be arranged on the display panel 10. The input sensing layer 30 may sense an external input by a mutual capacitance method and/or a self-capacitance method.

The input sensing layer 30 may be directly formed on the display panel 10. For example, the input sensing layer 30 may be formed immediately after the process of forming the display panel 10, and no adhesive layer may be located between the input sensing layer 30 and the display panel 10. Alternatively, the input sensing layer 30 may be separately formed and then coupled through an adhesive layer. The adhesive layer may include an optical transparent adhesive.

The optical functional layer 40 may include an anti-reflection layer. The anti-reflection layer may reduce the reflection of light (external light) incident from the outside through the window 50 toward the display panel 10. The anti-reflection layer may include a phase retarder and a polarizer. The phase retarder may be a film type or a liquid crystal coating type and may include a λ/2 phase retarder and/or a λ/4 phase retarder. The polarizer may also be a film type or a liquid crystal coating type. The film type may include a stretched synthetic resin film, and the liquid crystal coating type may include liquid crystals arranged in a certain arrangement. The phase retarder and the polarizer may further include a protection film. The phase retarder or the polarizer itself or the protection film may be defined as a base layer of the anti-reflection layer.

In embodiments, the anti-reflection layer may include a black matrix and color filters. The color filters may be arranged considering the color of light emitted from each of the pixels of the display panel 10. In embodiments, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, such that reflection of the external light may be minimized and/or reduced.

The optical functional layer 40 may include a lens layer. The lens layer may improve the light emission efficiency of light emitted from the display panel 10 or may reduce a color deviation. The lens layer may include a layer having a concave or convex lens shape and/or may include a plurality of layers having different refractive indexes. The optical functional layer 40 may include both the anti-reflection layer and/or the lens layer.

The optical functional layer 40 may be coupled to the window 50 through an adhesive layer such as an optical clear adhesive (OCA).

The electronic component 20 may be located in the second display area DA2. The electronic component 20 may be arranged on the rear surface of the substrate 100 of the display panel 10. The electronic component 20 may include an electronic element using light or sound. For example, the electronic element may include a sensor (e.g., as a proximity sensor) for measuring a distance, a sensor for recognizing a portion of a user's body (e.g., a fingerprint, an iris, or a face), a small lamp for outputting light, or an image sensor (e.g., a camera) for capturing an image. The electronic element using light may use light of various wavelength bands such as visible light, infrared light, and ultraviolet light. The electronic element using sound may use ultrasound or sound of other frequency bands.

One or more electronic components 20 may be arranged in the second display area DA2. The electronic apparatus 1 may include a number of second display areas DA2 corresponding to the number of electronic components 20. The electronic apparatus 1 may include second display areas DA2 spaced apart from each other. A plurality of electronic components 20 may be arranged in one second display area DA2. For example, the electronic apparatus 1 may include a bar-shaped second display area DA2, and a plurality of electronic components 20 may be spaced from each other in the lengthwise direction of the second display area DA2.

The electronic component 20 may include a light emitter and a light receiver. The light emitter and the light receiver may be an integrated structure or may include a light emitter and a light receiver that collectively form one electronic component 20.

In alternative embodiments, the display panel 10 may be a display panel such as an inorganic light emitting display panel or an inorganic electroluminescence (EL) display panel including an inorganic material such as a micro LED, or a quantum dot light emitting display panel. For example, an emission layer of the display element included in the display panel 10 may include an organic material, may include an inorganic material, may include quantum dots, may include an organic material and quantum dots, or may include an inorganic material and quantum dots.

Figure 3:
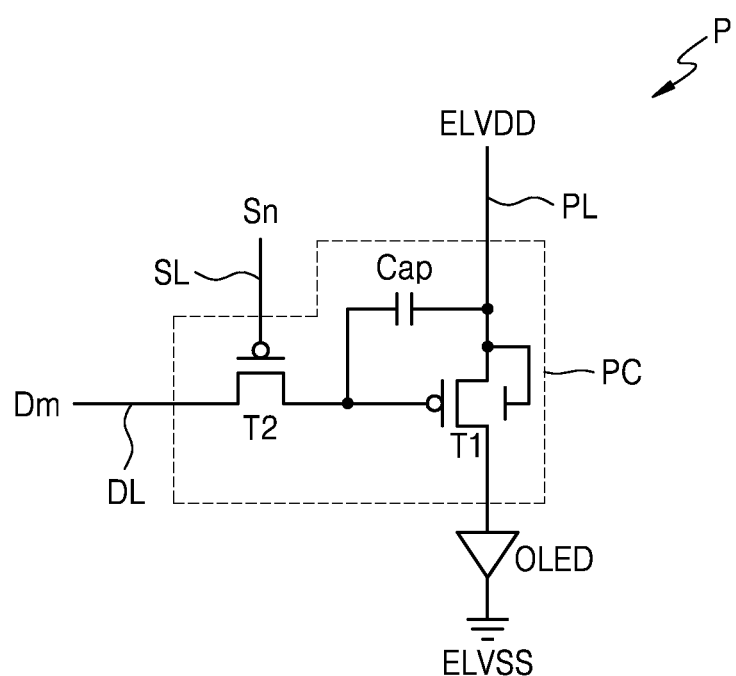
FIG. 3 is an equivalent circuit diagram illustrating a pixel circuit included in a display panel according to an embodiment.

FIG. 3 is an equivalent circuit diagram illustrating a pixel circuit included in a display panel according to an embodiment.

Referring to FIG. 3, a pixel of the display panel 10 may include a pixel circuit PC. The display panel 10 may include an organic light emitting diode OLED that emits light by receiving a driving voltage through the pixel circuit PC.

The pixel circuit PC may include a plurality of thin film transistors and a storage capacitor. The pixel circuit PC may include a first thin film transistor T1, a second thin film transistor T2, and a storage capacitor Cap. The first thin film transistor T1 may be a driving thin film transistor (driving TFT), and the second thin film transistor T2 may be a switching thin film transistor (switching TFT). The second thin film transistor T2 may be connected to a scan line SL and a data line DL and may transmit a data signal Dm input through the data line DL to the first thin film transistor T1 according to a scan signal Sn input through the scan line SL.

The storage capacitor Cap may be connected to the second thin film transistor T2 and a driving voltage line PL and may store a voltage corresponding to the difference between a first voltage ELVDD applied to the driving voltage line PL and a second voltage applied to the second thin film transistor T2.

The first thin film transistor T1 may be connected to the driving voltage line PL and the storage capacitor Cap and may control a driving current flowing from the driving voltage line PL to the organic light emitting diode OLED in response to a voltage value stored in the storage capacitor Cap. An opposite electrode of the organic light emitting diode OLED may be connected to a common voltage ELVSS. The organic light emitting diode OLED may emit light with a certain brightness according to the driving current to display an image.

FIG. 3 illustrates that the pixel circuit PC includes two thin film transistors and one storage capacitor. The pixel circuit PC may include three or more thin film transistors and/or two or more storage capacitors. The pixel circuit PC may include seven thin film transistors and one storage capacitor. The number of thin film transistors and the number of storage capacitors may be determined according to the design of the pixel circuit PC.

Figure 4A:
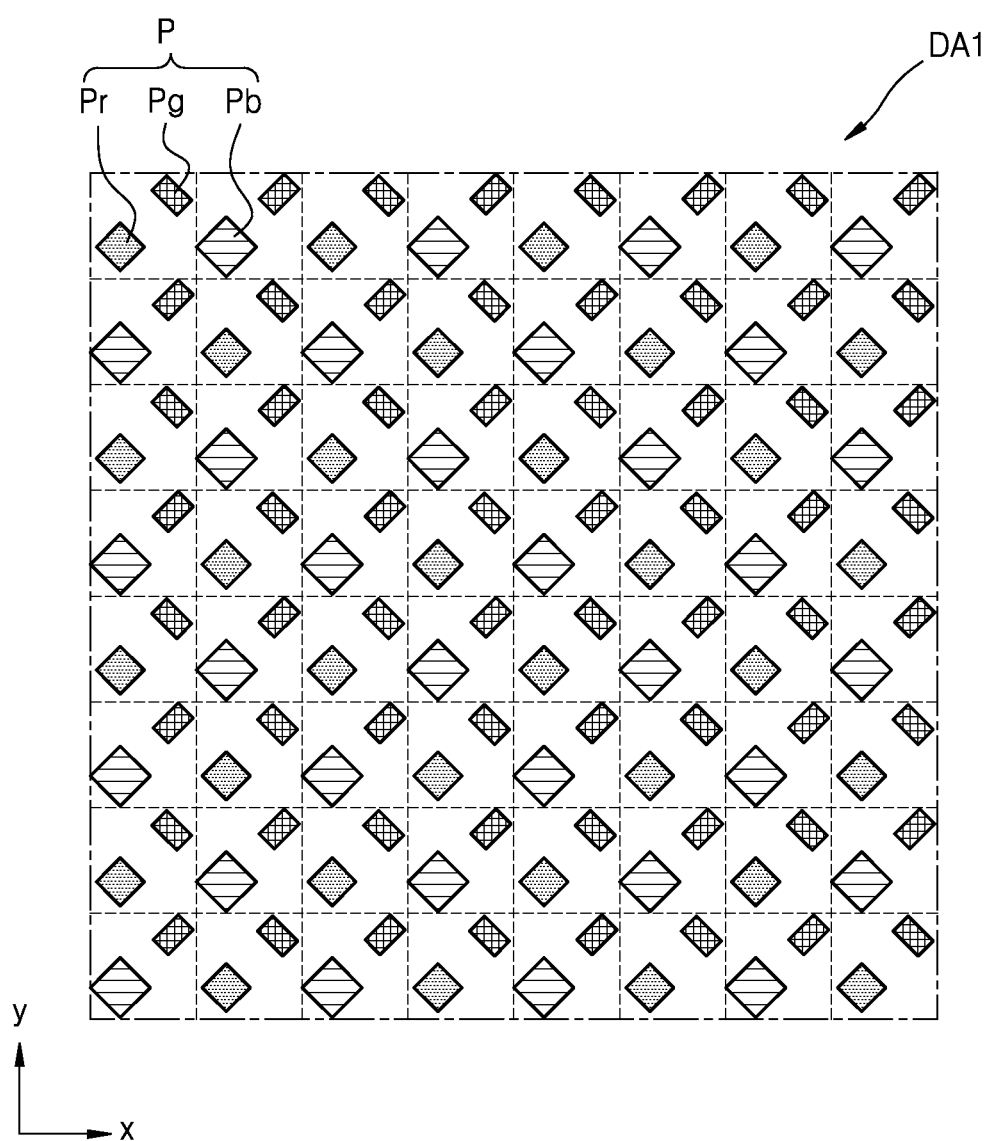
FIG. 4A is a plan view schematically illustrating an arrangement of pixels in a first display area of a display panel according to an embodiment.
Figure 4B:
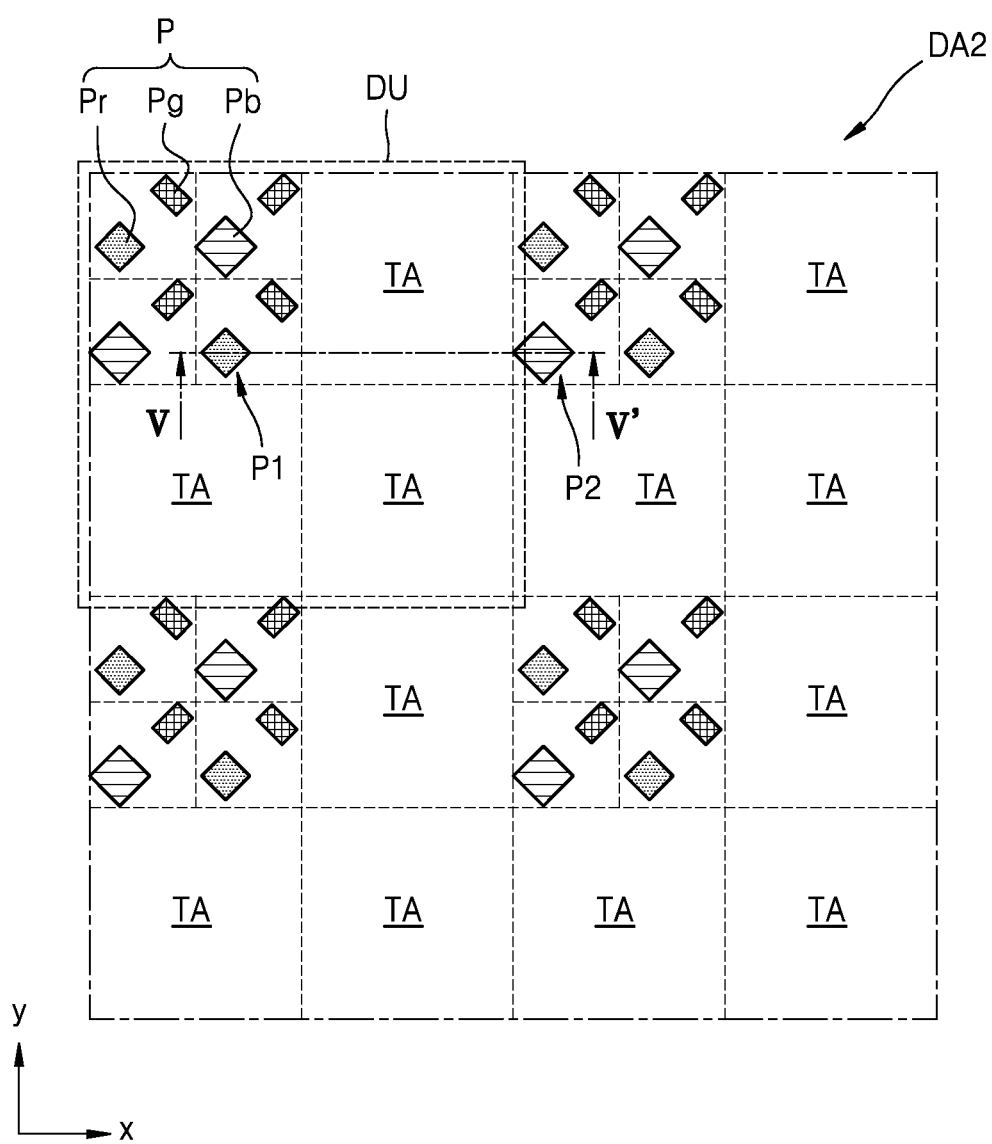
FIG. 4B is a plan view schematically illustrating an arrangement of pixels in a second display area of a display panel according to an embodiment.

FIG. 4A is a plan view schematically illustrating an arrangement of pixels in a first display area of a display panel according to an embodiment, and FIG. 4B is a plan view schematically illustrating an arrangement of pixels in a second display area of a display panel according to an embodiment.

Referring to FIG. 4A, pixels P may be arranged in the first display area DA1. The pixels P may include a red pixel Pr, a green pixel Pg, and a blue pixel Pb. The red pixel Pr, the green pixel Pg, and the blue pixel Pb may be arranged in a PENTILE™ configuration. The red pixel Pr, the green pixel Pg, and the blue pixel Pb may be arranged in a stripe configuration.

The red pixel Pr, the green pixel Pg, and the blue pixel Pb may have different sizes (e.g., widths). For example, the blue pixel Pb may be larger than the red pixel Pr and the green pixel Pg, and the red pixel Pr may be larger than the green pixel Pg. Each green pixel Pg may have a rectangular shape, and adjacent green pixels Pg may be oriented in different directions.

Referring to FIG. 4B, the second display area DA2 may include display units DU that are repeatedly arranged. A pixel array may be formed as the display units DU are repeatedly arranged in the x direction and/or the y direction in the second display area DA2.

A display unit DU includes pixels P. The pixels P may include a red pixel Pr, a green pixel Pg, and a blue pixel Pb. The red pixel Pr, the green pixel Pg, and the blue pixel Pb may be arranged in a PENTILE™ configuration. The red pixel Pr, the green pixel Pg, and the blue pixel Pb may be arranged in a stripe configuration.

A display unit DU of the second display area DA2 may include transmission areas TA. In the second display area DA2, the transmission areas TA may be arranged adjacent to the pixels P. For example, transmission area TA may be arranged between the pixels P. The pixels P arranged in the second display area DA2 may include first pixels P1 and second pixels P2 separated from each other by an intervening transmission area TA. Two pixels P separated the x direction may be respectively referred to as a first pixel P1 and a second pixel P2; two pixels P separated in the y direction by an intervening transmission area TA may be referred to as a first pixel P1 and a second pixel P2.

For example, in the second display area DA2, eight pixels P may form one pixel set and adjacent pixel sets may be separated by an intervening transmission area TA. FIG. 4A illustrates the display unit DU including one pixel set and three transmission areas TA arranged in an L shape. A display unit DU may include transmission areas TA that entirely surround a plurality of pixel sets. A display unit DU may include transmission areas TA and pixel sets that are alternately arranged in a grid configuration.

Figure 5:
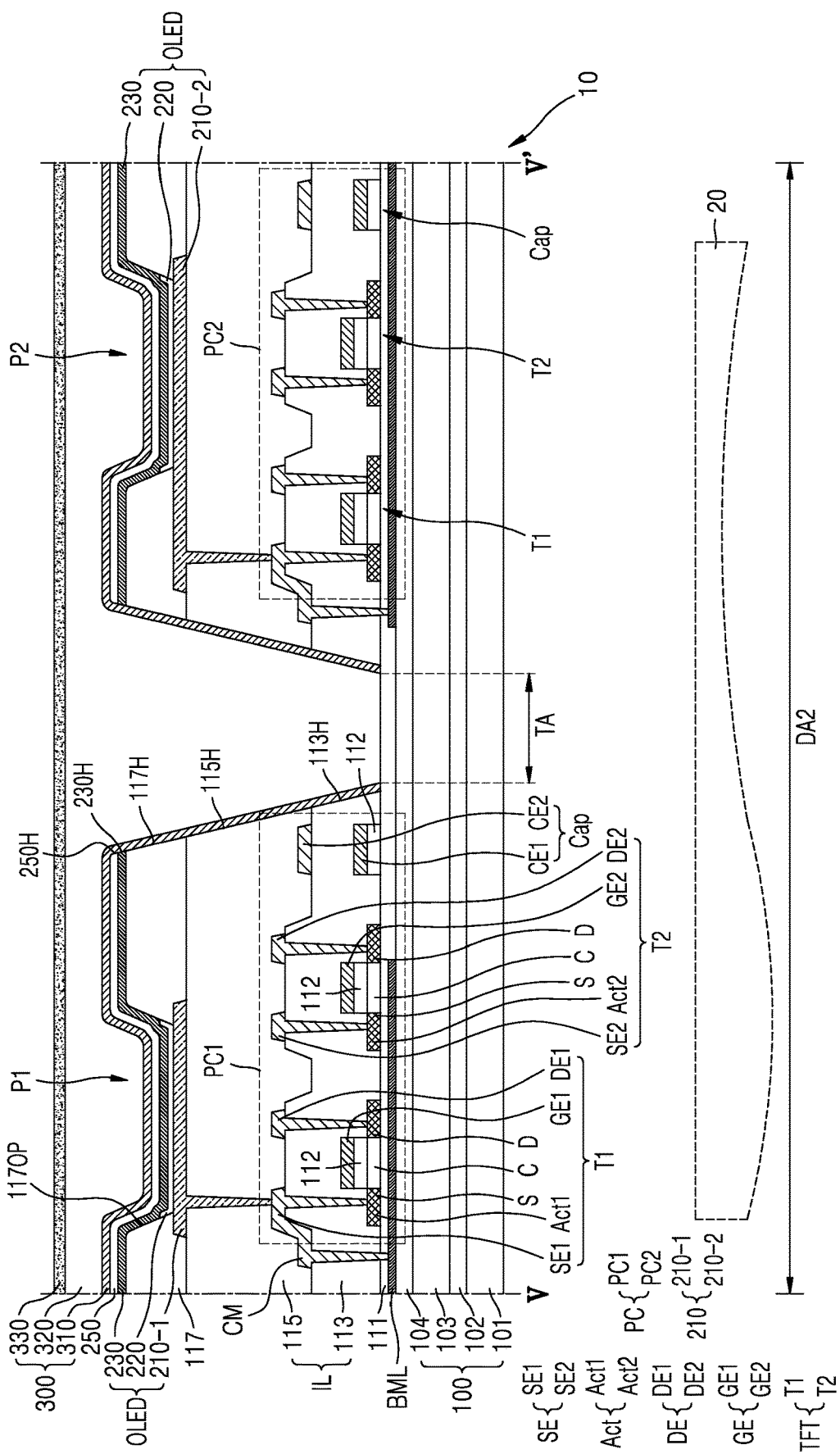
FIG. 5 is a cross-sectional view schematically illustrating a portion of an electronic apparatus according to an embodiment.

FIG. 5 is a cross-sectional view taken along line V-V' of FIG. 4B according to an embodiment.

Referring to FIG. 5, the substrate 100 may have a multilayer structure including a polymer resin and an inorganic material. The substrate 100 may include at least one base layer including a polymer resin and at least one barrier layer including an inorganic insulating material. For example, the substrate 100 may include a first base layer 101, a first barrier layer 102, a second base layer 103, and a second barrier layer 104 that are sequentially stacked.

The first base layer 101 and the second base layer 103 may include a transparent polyimide (PI) resin. The polyimide resin may include a polymer of a dianhydride compound and a diamine compound. The polyimide resin may include a polymer compound including a repeating unit represented by Formula 1 below.

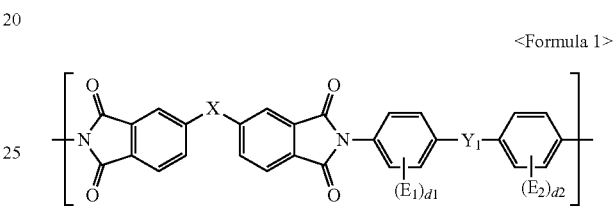

<Formula 1>

In Formula 1,
X may be one of $C(CR_1R_2R_3)_2$, O, $SO_2$, and C=O;
$R_1$ to $R_3$ may be independently one of —F, —Cl, —Br, and —I;
$Y_1$ may be one of a single bond, O, and $SO_2$;
$E_1$ and $E_2$ may be independently hydrogen or —$CF_3$;
$d_1$ and $d_2$ may be independently an integer in a range of 1 to 4; $d_1$ and $d_2$ may be respectively the numbers/quantities of $E_1$ and $E_2$; when $d_1$ is greater than or equal to 2, occurrences of $E_1$ may be identical to or different from each other, and when $d_2$ is greater than or equal to 2, occurrences of $E_2$ may be identical to or different from each other.

In an embodiment, in Formula 1, X may be $C(CF_3)_2$, Y may be a single bond, and each of $E_1$ and $E_2$ may be —$CF_3$.

[Repeating Unit]

The polymer compound may include a repeating unit represented by Formula 1. The polymer compound may include one kind of repeating unit or may include two or more kinds of repeating units having different structures.

In an embodiment, the polyimide resin may include a polymer compound including a repeating unit represented by Formula 2 below.

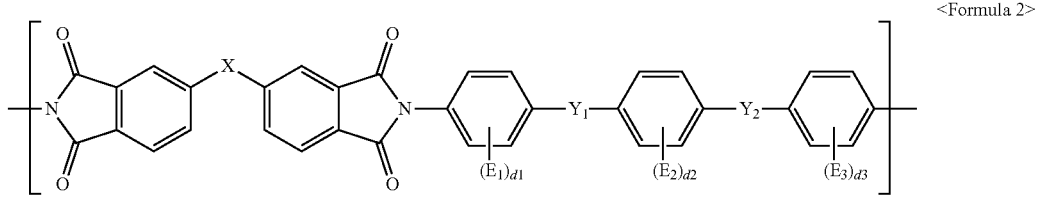

<Formula 2>

In Formula 2,
X may be one of $C(CR_1R_2R_3)_2$, O, $SO_2$, and C=O;
$R_1$ to $R_3$ may be independently one of —F, —Cl, —Br, and —I;
$Y_1$ may be one of a single bond, O, and $SO_2$, $Y_2$ may be one of a single bond, O, and $SO_2$, $E_1$ to $E_3$ may be independently hydrogen or —$CF_3$;

$d_1$ to $d_3$ may be independently an integer of 1 to 4; $d_1$ and $d_2$ may be respectively the numbers/quantities of $E_1$ and $E_2$; when $d_1$ is greater than or equal to 2, occurrences of $E_1$ may be identical to or different from each other, and when $d_2$ is greater than or equal to 2, occurrences $E_2$ may be identical to or different from each other.

The number average molecular weight (Mn) of the polymer compound is not particularly limited as long as the desired effect of the disclosure may be obtained. According to an embodiment, the number average molecular weight of the polymer compound may be in a range of about 10,000 to about 200,000, for example, in a range of about 10,000 to about 80,000.

The first base layer 101 and the second base layer 103 including the polyimide resin may have transparency and may be substantially/sufficiently colorless.

The first barrier layer 102 and the second barrier layer 104 may include an inorganic insulating material such as silicon oxide, silicon oxynitride, and/or silicon nitride.

The electronic component 20 may be arranged in the second display area DA2, and the light emitted from the electronic component 20 and/or the light directed to the electronic component 20 may be transmitted through the transmission area TA. Thus, the transmittance in the transmission area TA and/or the transmittance in the second display area DA2 may affect the performance of the electronic component 20.

According to an embodiment, in order to improve the transmittance in the transmission area TA, the substrate 100 may include a transparent polyimide resin. The property of 'transparency' may be defined by a yellowness index (YI). When the YI is about 10 or less, the corresponding element may be defined as having 'transparency'. The YI may be measured according to the ASTM E313 standard. Accordingly, "transparent polyimide resin" or "layer of transparent polyimide resin" may refer to a material or layer having a YI of about 10 or less, measured according to the ASTM E313 standard.

As a comparative example, a substrate including a polyimide resin represented by Formula 3 below may change in its energy level as electrons in the main chain of polyimide are transitioned, may absorb light, and may have a yellow to dark brown color that is a complementary color of the color of absorbed light.

<Formula 3>

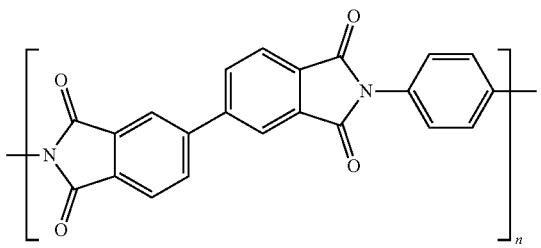

In the comparative example, the YI may be about 25. In the case of a single layer including the polyimide resin of the comparative example, the transmittance of light having a wavelength band of about 400 nm or less may be about 20% or less.

In contrast, according to an embodiment, the transparent polyimide resin included in the substrate 100 may include a highly electronegative substituent such as trifluoromethyl (—$CF_3$), and accordingly, the transparency (and colorlessness) of the substrate 100 may be maintained through reducing the movement of electrons by increasing the amorphous nature in the polyimide resin. In an embodiment, the YI may be about 2.6, which is about 1/10 of that of the comparative example. With a single layer including the transparent polyimide resin, the transmittance of light having a wavelength band of about 400 nm or less may be about 70% or more and about 90% or less.

The polyimide resin included in the substrate 100 may additionally include a highly electronegative substituent such as ether (—O—), sulfone (—$SO_2$—), or carbonyl (—CO) in the main chain, and accordingly, the transparency (and colorlessness) of the substrate 100 may be maintained by reducing the density of the main chain because the polyimide resin may form a curved chain structure.

In embodiments, the transmittance degradation in the transmission area TA may be minimized by maintaining the transparency of the substrate 100 of the display panel 10. Accordingly, the performance of the electronic component 20 of the electronic apparatus 1 may be improved.

In an embodiment, when the input sensing layer 30, the optical functional layer 40, and the window 50 are all provided on the display panel 10, the light transmittance of the electronic apparatus 1 may be about 50% or more. On the other hand, for an electronic apparatus including the single layer of the comparative example as a substrate, the light transmittance may not exceed about 30%. Thus, according to an embodiment, more desirable performance of the electronic component 20 of the electronic apparatus 1 may be implemented.

A buffer layer 111 may be arranged on the substrate 100. The buffer layer 111 may reduce or block the penetration of foreign materials, moisture, or external air from the bottom of the substrate 100 and may provide a flat surface on the substrate 100. The buffer layer 111 may include an inorganic insulating material such as silicon oxide, silicon oxynitride, or silicon nitride and may be a single-layer or multilayer structure including the above material.

A first pixel circuit PC1 and a second pixel circuit PC2 may be arranged on the buffer layer 111. Each of the first pixel circuit PC1 and the second pixel circuit PC2 may correspond to the pixel circuit PC described above with reference to FIG. 3. Each of the first pixel circuit PC1 and the second pixel circuit PC2 may include thin film transistors TFT and a storage capacitor Cap. The first pixel circuit PC1 and the second pixel circuit PC2 may have substantially the same structure.

The first pixel circuit PC1 may include a first thin film transistor T1 and a second thin film transistor T2. The first thin film transistor T1 and the second thin film transistor T2 may each include a semiconductor layer Act, a gate electrode GE overlapping the channel area of the semiconductor layer Act, and a source electrode SE and a drain electrode DE respectively connected to the source area and the drain area of the semiconductor layer Act. The first thin film transistor T1 may include a first semiconductor layer Act1, a first gate electrode GE1, a first source electrode SE1, and a first drain electrode DE1; the second thin film transistor T2 may include a second semiconductor layer Act2, a second gate electrode GE2, a second source electrode SE2, and a second drain electrode DE2. Each of the semiconductor layers Act1 and Act2, each of the gate electrodes GE1 and GE2, each of the source electrodes SE1 and SE2, and each of the drain electrodes DE1 and DE2 may be respectively referred to as a semiconductor layer Act, a gate electrode GE, a source electrode SE, and a drain electrode DE.

The storage capacitor Cap may include a lower electrode CE1 and an upper electrode CE2 overlapping each other. In some embodiments, the storage capacitor Cap may overlap the thin film transistor TFT, and the gate electrode GE of the thin film transistor TFT may include the lower electrode CE1 of the storage capacitor Cap.

The first pixel circuit PC1 and the second pixel circuit PC2 may be arranged over the substrate 100 in the second display area DA2 and may be spaced apart from each other by an intervening transmission area TA. The display panel 10 may include a first display element (e.g., an OLED) including a first pixel electrode 210-1 electrically connected to the thin film transistor TFT of the first pixel circuit PC1 and may include a second display element including a second pixel electrode 210-2 electrically connected to the thin film transistor TFT of the second pixel PC2.

The semiconductor layer Act may be arranged on the buffer layer 111. The semiconductor layer Act may include a channel area C and a source area S and a drain area D respectively arranged on two sides of the channel area C. The semiconductor layer Act may be/include a single layer structure or a multiple layer structure.

The semiconductor layer Act may include a polysilicon material. The semiconductor layer Act may include an oxide semiconductor material. For example, the semiconductor layers Act1 and Act2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer Act may include an InSnZnO (ITZO) semiconductor layer, an InGaZnO (IGZO) semiconductor layer, or an InSnGaZnO (ITGZO) semiconductor layer. Because the oxide semiconductor has a wide band gap (about 3.1 eV), a high carrier mobility, and a low leakage current, the semiconductor layer Act may advantageously minimize luminance change due to a voltage drop in low-frequency driving for long driving time. The power consumption of the display panel 10 may be reduced, and the response speed of the display panel 10 may be improved.

In a comparative example, a semiconductor layer includes a polysilicon material, the highest temperature in the process of forming an amorphous silicon layer and irradiating an excimer laser to crystallize the amorphous silicon layer or in an associated heat treatment process may be about 450° C. or more. Because the transparent polyimide resin according to an embodiment may have a heat resistance in the range up to about 415° C., when a semiconductor layer of polycrystalline silicon is formed over the substrate 100 including the transparent polyimide resin, damage (burning) may occur in the substrate 100. In an embodiment, a semiconductor layer Act includes an oxide semiconductor material; because the highest temperature of a heat treatment process used in the process of manufacturing the semiconductor layer Act including an oxide semiconductor material may not exceed about 370° C., damage to the substrate 100 may be prevented.

In a comparative example, a semiconductor layer includes a polysilicon material and is positioned over the substrate 100 including the transparent polyimide resin. When a crystallization process and a subsequent heat treatment process are performed at 400° C. or less in order to avoid damage to the substrate 100, a layer break may occur due to the diffusion of hydrogen in amorphous silicon. In an embodiment, a semiconductor layer Act includes an oxide semiconductor material and is positioned over the substrate 100 including the transparent polyimide resin. According to an embodiment, the transmittance of the substrate 100 may be improved, damage to the substrate 100 may be prevented, and a layer break in the semiconductor layer Act may be prevented.

A lower conductive layer BML may be arranged under the semiconductor layer Act. The lower conductive layer BML may be arranged between the substrate 100 and the buffer layer 111. The lower conductive layer BML may include a conductive material including molybdenum (Mo), aluminum (Al), copper (Cu), titanium (Ti), or the like and may be/include a single layer or multiple layer structure.

The lower conductive layer BML may overlap the semiconductor layer Act including an oxide semiconductor material. The lower conductive layer BML may have an island shape. Because the semiconductor layer Act including an oxide semiconductor material is vulnerable to light, the lower conductive layer BML may prevent the device characteristics of the thin film transistors T1 and T2 (including an oxide semiconductor material) from changing due to a photocurrent induced in the semiconductor layer Act by the external light incident from the side of the substrate 100.

The gate electrode GE may be arranged over the semiconductor layer Act. The gate electrode GE may at least partially overlap the semiconductor layer Act. The gate electrode GE may be/include a single layer or multiple layer structure formed of at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A gate insulating layer 112 may be arranged between the semiconductor layer Act and the gate electrode GE. The gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate insulating layer 112 may partially overlap a portion of the semiconductor layer Act. The gate insulating layer 112 may expose the source area S and the drain area D of the semiconductor layer Act, and a side surface of the gate insulating layer 112 and a side surface of the gate electrode GE may be etched surfaces on the same plane. The area of the semiconductor layer Act overlapping the gate insulating layer 112 may be the channel area C. In embodiments, the gate insulating layer 112 may be arranged over the entire surface of the substrate 100 to entirely cover the semiconductor layer Act.

An interlayer insulating layer 113 may be arranged on the semiconductor layer Act and the gate electrode GE. The interlayer insulating layer 113 may cover the semiconductor layer Act and the gate electrode GE. The interlayer insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The source electrode SE and the drain electrode DE may be arranged on the interlayer insulating layer 113. The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multilayer structure. For example, the source electrode SE and/or the drain electrode DE may have a three-layer structure of a titanium layer, an aluminum layer, and a titanium layer. The source electrode SE and the drain electrode DE may be respectively electrically connected to the source area S and the drain area D of the semiconductor layer Act through contact holes formed in the interlayer insulating layer 113.

The storage capacitor Cap may include a lower electrode CE1 and an upper electrode CE2. The lower electrode CE1 and the upper electrode CE2 may overlap each other. The lower electrode CE1 of the storage capacitor Cap may be arranged on the buffer layer 111, and the gate insulating layer 112 may be located between the buffer layer 111 and the lower electrode CE1. The lower electrode CE1 may be covered by the interlayer insulating layer 113 and may include the same material as the gate electrode GE. In embodiments, the first gate electrode GE1 of the first thin film transistor T1 may function as the lower electrode CE1 of the storage capacitor Cap. The upper electrode CE2 of the storage capacitor Cap may be arranged on the interlayer insulating layer 113. The upper electrode CE2 may include the same material as the source electrode SE or the drain electrode DE.

A planarization layer 115 may be arranged on the interlayer insulating layer 113. The planarization layer 115 may include an organic insulating material and may be/include a single layer or multiple layer structure. The planarization layer 115 may cover the pixel circuit PC to provide a flat top surface. The planarization layer 115 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend of some of the above materials.

A pixel electrode 210 (e.g., 210-1 or 210-2) may be arranged on the planarization layer 115. The pixel electrode 210 may be connected to the first source electrode SE1 or the first drain electrode DE1 of the first thin film transistor T1 through a contact hole formed in the planarization layer 115, and thus, the pixel electrode 210 may be electrically connected to the pixel circuit PC.

The pixel electrode 210 may include a reflection layer including at least one of silver (Ag), magnesium (Mg), aluminum (Al), platinum (Pt), palladium (Pd), gold (Au), nickel (Ni), neodymium (Nd), iridium (Ir), and chromium (Cr). The pixel electrode 210 may include a transparent conductive layer arranged over and/or under the reflection layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 210 may have a three-layer structure of an ITO layer, an Ag layer, and an ITO layer sequentially stacked.

A pixel definition layer 117 may be arranged on the pixel electrode 210. The pixel definition layer 117 may cover an edge of the pixel electrode 210 and may include an opening 1170P exposing a center portion of the pixel electrode 210.

The pixel definition layer 117 may increase the distance between the edge of the pixel electrode 210 and an opposite electrode 230 over the pixel electrode 210 to prevent an arc from occurring at the edge of the pixel electrode 210. The pixel definition layer 117 may be formed of an organic insulating material such as polyimide, polyamide, acrylic resin, benzocyclobutene, hexamethyldisiloxane (HMDSO), or phenol resin by spin coating or the like.

An intermediate layer 220 corresponding to the pixel electrode 210 may be arranged on the pixel definition layer 117. The intermediate layer 220 may be arranged on the pixel electrode 210. The intermediate layer 220 may include an emission layer and may include a high-molecular or low-molecular weight organic material for emitting light of a certain color. The intermediate layer 220 may include at least one functional layer selected from a hole transport layer (HTL), a hole injection layer (HIL), an electron transport layer (ETL), and an electron injection layer (EIL). The functional layer(s) may include an organic material.

The opposite electrode 230 may be arranged on the intermediate layer 220. The opposite electrode 230 may include a conductive material having a relatively low work function. For example, the opposite electrode 230 may include a (semi)transparent layer including at least one of silver (Ag), magnesium (Mg), aluminum (Al), nickel (Ni), chromium (Cr), lithium (Li), and calcium (Ca). The opposite electrode 230 may include ITO, IZO, ZnO, or $In_2O_3$ on the (semi)transparent layer. The opposite electrode 230 may include silver (Ag) and magnesium (Mg). The opposite electrode 230 may be integrally formed and may entirely/substantially cover the first display area DA1 (see FIG. 1).

The stack structure of the pixel electrode 210, the intermediate layer 220, and the opposite electrode 230 may form a light emitting diode, for example, an organic light emitting diode OLED. The organic light emitting diode OLED may emit red, green, or blue light, and an emission area of each organic light emitting diode OLED may correspond to a pixel P. The opening 1170P of the pixel definition layer 117 defines the size and/or width of the pixel P.

A capping layer 250 may be formed on the opposite electrode 230. The capping layer 250 may include LiF. The capping layer 250 may include an inorganic insulating material such as silicon nitride and/or an organic insulating material. The capping layer 250 may be optional.

A thin film encapsulation layer 300 may be arranged on the capping layer 250. The organic light emitting diode OLED may be covered by the thin film encapsulation layer 300. The thin film encapsulation layer 300 may include inorganic encapsulation layers 310 and 330 and an organic encapsulation layer 320 between the layers 310 and 330.

The inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The inorganic encapsulation layers 310 and 330 may be formed through chemical vapor deposition.

The organic encapsulation layer 320 may include a polymer-based material. The polymer-based material may include acrylic resin, epoxy resin, polyimide, polyethylene, or the like. For example, the organic encapsulation layer 320 may include acrylic resin such as polymethylmethacrylate or polyacrylic acid. The organic encapsulation layer 320 may be formed by curing a monomer or applying a polymer. The organic encapsulation layer 320 may have transparency, may be transparent, and/or may be colorless.

On or more functional layers may be provided on the thin film encapsulation layer 300. The one or more functional layer may include a polarization layer for reducing the external light reflection, a black matrix, a color filter, and/or a touch input layer including a touch electrode.

Insulating layers located between the substrate 100 and the pixel electrode 210 may each include a hole corresponding to the transmission area TA. For example, the interlayer insulating layer 113 and the planarization layer 115 may include a first hole 113H and a second hole 115H that are located in the transmission area TA and overlap/expose each other. The pixel definition layer 117, the opposite electrode 230, the capping layer 250, and sublayers of the thin film encapsulation layer 300 arranged on the pixel electrode 210 may each include a hole formed corresponding to the transmission area TA. For example, the pixel definition layer 117, the opposite electrode 230, and the capping layer 250 may respectively include third to fifth holes 117H, 230H, and 250H that are located in the transmission area TA and overlap/expose each other.

The first to fifth holes 113H, 115H, 117H, 230H, and 250H may overlap/expose each other, and a portion of the organic encapsulation layer 320 of the thin film encapsulation layer 300 may be located in the first to fifth holes 113H, 115H, 117H, 230H, and 250H. Sufficient light transmittance in the transmission area TA may be attained.

A connection metal CM may be provided on the interlayer insulating layer 113. The connection metal CM may be connected to the lower conductive layer BML through a contact hole formed in the interlayer insulating layer 113 and the buffer layer 111. The connection metal CM may be formed on the same layer as the first source electrode SE1 or the first drain electrode DE1 of the first thin film transistor T1 electrically connected to the pixel electrode 210 and may be connected to the first source electrode SE1 or the first drain electrode DE1. For example, the connection metal CM may be integrally formed with the first source electrode SE1 or the first drain electrode DE1. Thus, the lower conductive layer BML may be electrically connected to the first semiconductor layer Act1 of the first thin film transistor T1 and may receive the first voltage ELVDD (see FIG. 3) that is a constant voltage. Accordingly, the lower conductive layer BML may be maintained in a stable state without being electrically trapped, and the driving efficiency of the thin film transistor may be improved.

Figure 6:
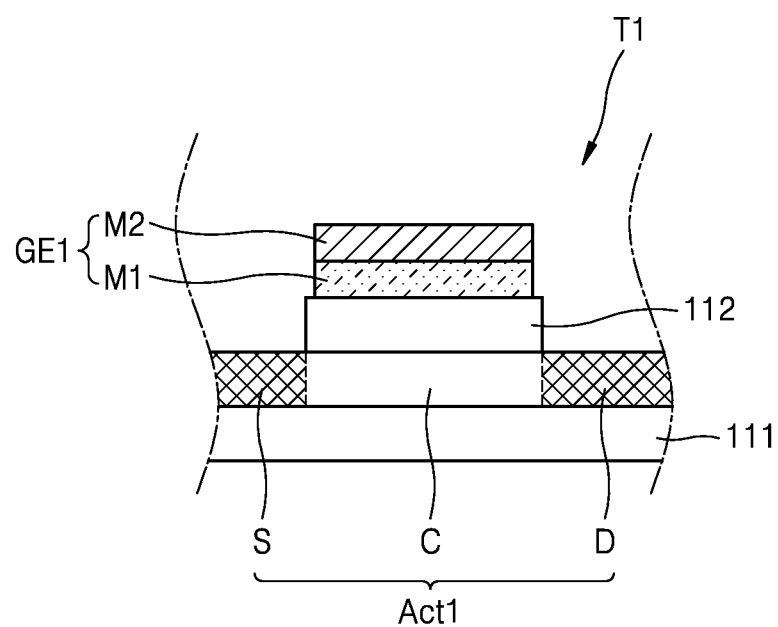
FIG. 6 is a cross-sectional view schematically illustrating a portion of a display panel of an electronic apparatus according to an embodiment.

FIG. 6 is a cross-sectional view schematically illustrating a portion of a display panel of an electronic apparatus according to an embodiment. FIG. 6 illustrates the first semiconductor layer Act1 and the first gate electrode GE1 of the first thin film transistor T1 of FIG. 5.

Referring to FIG. 6, the first semiconductor layer Act1 may include a channel area C overlapping the first gate electrode GE1 and may include a source area S and a drain area D respectively arranged on two sides of the channel area C.

In the process of manufacturing of the first thin film transistor T1, the hydrogen included in an inorganic layer such as the gate insulating layer 112 may be diffused into the channel area C. The channel area C may be doped with dopant ions, and the hydrogen diffused into the channel area C may affect the doping concentration of the channel area C. That is, when the hydrogen is diffused into the channel area C with the channel area C doped, because the threshold voltage of the first thin film transistor T1 may be shifted more in a positive (+) direction, the reliability of the thin film transistor may be degraded. Thus, it may be necessary to block the diffusion of hydrogen into the channel area C. For this purpose, the first gate electrode G1 may have a stack structure of a first layer M1 including molybdenum (Mo) and a second layer M2 including titanium (Ti). The second layer M2 may have a different material than the first layer M1. The titanium (Ti) of the second layer M2 may capture the hydrogen to prevent the hydrogen from being diffused into the channel area C.

Methods of manufacturing a display panel and an electronic apparatus discussed above may be within the scope of the disclosure.

According to an embodiment, a display panel and/or an electronic apparatus may include a display area extended to enable image representation also in an area where an electronic component is arranged. In a display panel and/or an electronic apparatus, the light transmittance in an display area where an electronic component is arranged is improved, thus the satisfactory performance of an electronic component may be attained and maintained. The power consumption of the electronic component may be minimized, and the response speed of the electronic component may be optimized.

Example embodiments described herein are illustrative and not for purposes of limitation. Descriptions of features or aspects within each embodiment may be available for other embodiments. Various changes in form and details may be made in the example embodiments without departing from the scope defined by the following claims.

What is claimed is:

1. A display panel including a transmission area, the display panel comprising:
   a substrate including a first base layer, wherein the first base layer includes a transparent polyimide resin;
   a first pixel circuit and a second pixel circuit over the substrate, spaced from each other with the transmission area between the first pixel circuit and the second pixel circuit, and each including transistors and a storage capacitor;
   a first display element electrically connected to the first pixel circuit; and
   a second display element electrically connected to the second pixel circuit.

2. The display panel of claim 1, wherein the transparent polyimide resin has a yellowness index (YI) of about 10 or less, and/or has a transmittance of light with a wavelength band of about 400 nm or less in a range of about 70% or to about 90%.

3. The display panel of claim 1, wherein the transparent polyimide resin includes a polymer compound including a repeating unit represented by Formula 1:

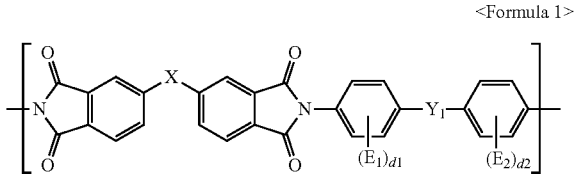

<Formula 1> where X is one of $C(CR_1R_2R_3)_2$, O, $SO_2$, and C=O;
$R_1$, $R_2$, and $R_3$ are independently one of —F, —Cl, —Br, and —I;
$Y_1$ is one of a single bond, O, and $SO_2$;
$E_1$ and $E_2$ are independently hydrogen or —$CF_3$; and
$d_1$ and $d_2$ are independently an integer in a range of 1 to 4.

4. The display panel of claim 3, wherein, in Formula 1, X is $C(CF_3)_2$, Y is a single bond, and each of $E_1$ and $E_2$ is —$CF_3$.

5. The display panel of claim 1, wherein the transparent polyimide resin includes a polymer compound including a repeating unit represented by Formula 2:

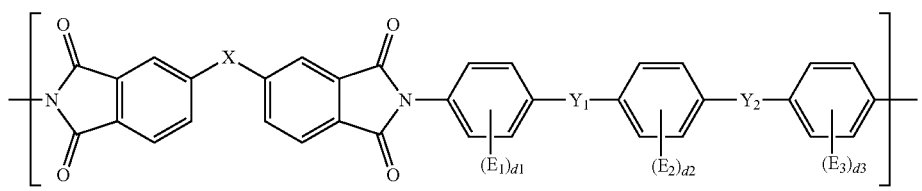

<Formula 2> where X is one of $C(CR_1R_2R_3)_2$, O, $SO_2$, and C=O;
$R_1$, $R_2$, and $R_3$ are independently one of —F, —Cl, —Br, and —I;
$Y_1$ is one of a single bond, O, and $SO_2$;
$Y_2$ is one of a single bond, O, and $SO_2$;
$E_1$, $E_2$, and $E_3$ are independently hydrogen or —$CF_3$; and
$d_1$, $d_2$, and $d_3$ are independently an integer in range of 1 to 4.

6. The display panel of claim 1, wherein the transistors of the first pixel circuit and the transistors of the second pixel circuit respectively comprise a semiconductor layer, and wherein the semiconductor layer includes an oxide semiconductor material.

7. The display panel of claim 1, wherein the substrate further includes a first barrier layer and a second base layer, wherein the first barrier layer is positioned between the first base layer and the second base layer, wherein the second base layer includes the transparent polyimide resin, and wherein the first barrier layer includes an inorganic insulating material.

8. The display panel of claim 1, further comprising:
a planarization layer covering the first pixel circuit and the second pixel circuit, wherein the first display element comprises:
a first pixel electrode arranged on the planarization layer and electrically connected to the first pixel circuit through a contact hole formed in the planarization layer;
an intermediate layer arranged on the first pixel electrode; and
an opposite electrode arranged on the intermediate layer.

9. The display panel of claim 8, further comprising:
an encapsulation layer covering the opposite electrode and including at least one inorganic layer and at least one organic layer.

10. The display panel of claim 9, further comprising at least one insulating layer overlapping the substrate and including a first hole, wherein the first hole is positioned between the first pixel circuit and the second pixel circuit and partially exposes the substrate, wherein the planarization layer includes a second hole corresponding to the first hole, and wherein the at least one organic layer is at least partially located in each of the first hole and the second hole.

11. The display panel of claim 1, further comprising a conductive layer positioned between the first pixel circuit and the substrate and electrically connected to any one of the transistors of the first pixel circuit.

12. The display panel of claim 11, wherein the any one of the transistors of the first pixel circuit comprises a semiconductor layer electrically connected to the conductive layer.

13. The display panel of claim 12, further comprising:
a first electrode contacting the semiconductor layer through a first contact hole formed in the at least one insulating layer; and
a connection metal contacting the conductive layer through a second contact hole formed in the at least one insulating layer,
wherein the first electrode and the connection metal are formed of a same material and are electrically connected to each other.

14. The display panel of claim 1, wherein the transistors of the first pixel circuit comprise a gate electrode that includes:
a first conductive layer; and
a second conductive layer contacting the first conductive layer,
wherein the second conductive layer includes titanium, and wherein the first conductive layer includes a different material than the second conductive layer.

15. An electronic apparatus comprising:
a display panel including a transmission area; and
an electronic component overlapping the transmission area,
wherein the display panel includes:
a substrate including a first base layer, wherein the first base layer includes a transparent polyimide resin;
a first pixel circuit and a second pixel circuit over the substrate, spaced from each other with the transmission area between the first pixel circuit and the second pixel circuit, and each including transistors and a storage capacitor;
a planarization layer arranged on the first pixel circuit and the second pixel circuit;
a first pixel electrode and a second pixel electrode arranged on the planarization layer and respectively electrically connected to the first pixel circuit and the second pixel circuit through two contact holes formed in the planarization layer;
an opposite electrode overlapping the first pixel electrode and the second pixel electrode; and
an intermediate layer positioned between the first pixel electrode and the opposite electrode.

16. The electronic apparatus of claim 15, wherein the transparent polyimide resin has a yellowness index (YI) of about 10 or less, and/or has a transmittance of light with a wavelength band of about 400 nm or less in a range of about 70% or to about 90%.

17. The electronic apparatus of claim 15, wherein the transparent polyimide resin includes a polymer compound including a repeating unit represented by Formula 1:

<Formula 1>

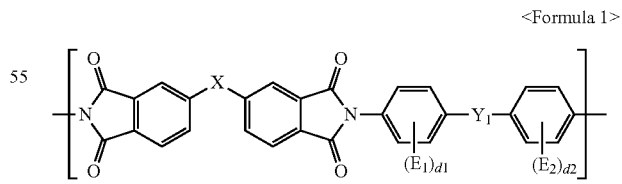

where X is one of $C(CR_1R_2R_3)_2$, O, $SO_2$, and C=O;
$R_1$, $R_2$, and $R_3$ are independently one of —F, —Cl, —Br, and —I;
$Y_1$ is one of a single bond, O, and $SO_2$;
$E_1$ and $E_2$ are independently hydrogen or —$CF_3$; and
$d_1$ and $d_2$ are independently an integer in a range of 1 to 4.

18. The electronic apparatus of claim 15, wherein the transparent polyimide resin includes a polymer compound including a repeating unit represented by Formula 2:

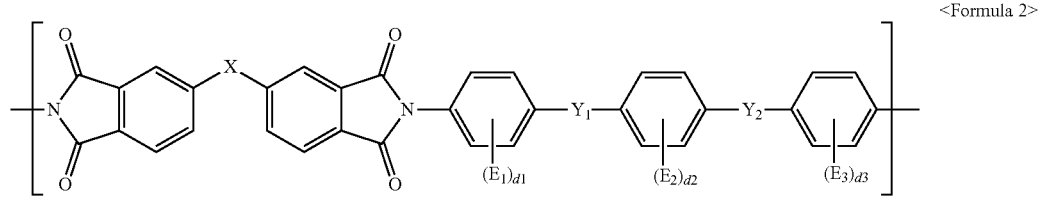

<Formula 2> where X is one of $C(CR_1R_2R_3)_2$, O, $SO_2$, and C=O;
$R_1$, $R_2$, and $R_3$ are independently one of —F, —Cl, —Br, and —I;
$Y_1$ is one of a single bond, O, and $SO_2$;
$Y_2$ is one of a single bond, O, and $SO_2$;
$E_1$, $E_2$, and $E_3$ are independently hydrogen or —$CF_3$; and
$d_1$, $d_2$, and $d_3$ are independently an integer in a range of 1 to 4.

19. The electronic apparatus of claim 15, further comprising:
at least one insulating layers located between the substrate and the planarization layer and including a hole that at least partially exposes the substrate; and
an encapsulation layer covering the opposite electrode and including at least one inorganic layer and at least one organic layer,
wherein the at least one organic layer is at least partially located in the hole.

20. The electronic apparatus of claim 15, further comprising a conductive layer arranged between the semiconductor layer and the first base layer and electrically connected to the semiconductor layer.

* * * * *